(12) United States Patent
Kitajima et al.

(10) Patent No.: US 10,081,090 B2
(45) Date of Patent: Sep. 25, 2018

(54) METHOD OF MANUFACTURING AN UPPER ELECTRODE OF A PLASMA PROCESSING DEVICE

(71) Applicant: TOKYO ELECTRON LIMITED, Tokyo (JP)

(72) Inventors: Tsuguo Kitajima, Miyagi (JP); Yasumasa Ishihara, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 239 days.

(21) Appl. No.: 15/060,384

(22) Filed: Mar. 3, 2016

(65) Prior Publication Data

US 2016/0184966 A1   Jun. 30, 2016

Related U.S. Application Data

(63) Continuation of application No. 14/238,039, filed as application No. PCT/JP2012/070357 on Aug. 9, 2012, now abandoned.

(Continued)

(30) Foreign Application Priority Data

Aug. 11, 2011   (JP) .................................. 2011-176006

(51) Int. Cl.
*B24C 1/08*   (2006.01)
*H01J 37/32*   (2006.01)
(Continued)

(52) U.S. Cl.
CPC ................ *B24C 1/08* (2013.01); *B24C 11/00* (2013.01); *C23C 4/134* (2016.01); *C23C 8/36* (2013.01);
(Continued)

(58) Field of Classification Search
CPC .......... H01J 37/32009; H01J 37/32018; H01J 37/32091; H01J 37/3244; H01J 37/32532;
(Continued)

(56) References Cited

U.S. PATENT DOCUMENTS 6,203,405 B1 *   3/2001   Hansen ................... B24C 11/00
                                                              451/38
6,431,958 B1 *   8/2002   Bru-Magniez .......... B24C 11/00
                                                              427/198
(Continued)

FOREIGN PATENT DOCUMENTS

JP    7-176524 A      7/1995
JP    2004-228500 A   8/2004
(Continued)

OTHER PUBLICATIONS

English Translation (Machine) of Japanese Patent Publication JP 2004-247350, dated Dec. 2017.*

(Continued)

*Primary Examiner* — A. Dexter Tugbang
(74) *Attorney, Agent, or Firm* — Rothwell, Figg, Ernst & Manbeck, P.C.

(57) ABSTRACT

A method of manufacturing an upper electrode of a plasma processing device includes forming a covering layer having plasma resistance on a surface of a main body portion constituting the upper electrode at a side of the processing space; polishing a surface of the covering layer exposed to the processing space; and after the polishing, blasting the surface of the covering layer polished at the polishing.

6 Claims, 3 Drawing Sheets

Related U.S. Application Data

(60) Provisional application No. 61/528,780, filed on Aug. 30, 2011.

(51) Int. Cl.
| | | |
|---|---|---|
| *C23C 16/455* | (2006.01) | |
| *C23C 8/36* | (2006.01) | |
| *C23C 4/134* | (2016.01) | |
| *B24C 11/00* | (2006.01) | |
| *H01L 21/311* | (2006.01) | |

(52) U.S. Cl.
CPC .. *C23C 16/45565* (2013.01); *C23C 16/45568* (2013.01); *H01J 37/32009* (2013.01); *H01J 37/32018* (2013.01); *H01J 37/3244* (2013.01); *H01J 37/32091* (2013.01); *H01J 37/32532* (2013.01); *H01J 37/32559* (2013.01); *H01J 37/32605* (2013.01); *H01L 21/31116* (2013.01); *Y10T 29/49156* (2015.01); *Y10T 29/49204* (2015.01)

(58) Field of Classification Search
CPC .......... H01J 37/32559; H01J 37/32605; H01L 21/31116; B24C 11/00; B24C 1/08; C23C 8/36; C23C 4/134; C23C 16/45565; C23C 16/45568; Y10T 29/49156; Y10T 29/49204

See application file for complete search history.

(56) References Cited

U.S. PATENT DOCUMENTS

| | | | |
|---|---|---|---|
| 2004/0060661 A1 | 4/2004 | Nishimoto et al. | |
| 2005/0098106 A1 | 5/2005 | Fink et al. | |
| 2007/0113783 A1 | 5/2007 | Lee et al. | |
| 2008/0318505 A1* | 12/2008 | Bajaj .................. | B24B 37/26 451/534 |
| 2010/0003829 A1 | 1/2010 | Patrick et al. | |

FOREIGN PATENT DOCUMENTS

| | | |
|---|---|---|
| JP | 2004-247350 A | 9/2004 |
| JP | 2007-511088 A | 4/2007 |
| JP | 2008-112751 A | 5/2008 |
| JP | 2008-198843 A | 8/2008 |
| JP | 2012018905 A * | 1/2012 |

OTHER PUBLICATIONS

International Search Report dated Nov. 13, 2012 for WO 2013/022066 A1.

* cited by examiner

METHOD OF MANUFACTURING AN UPPER ELECTRODE OF A PLASMA PROCESSING DEVICE

CROSS REFERENCE TO RELATED APPLICATIONS

This application is a continuation of and claims priority to co-pending U.S. patent application Ser. No. 14/238,039, filed on Feb. 19, 2014, which is a National Stage Application of PCT/JP2012/070357, filed on Aug. 9, 2012, and also claims priority from Japanese Patent Application No. 2011-176006, filed on Aug. 11, 2011 and U.S. Provisional Patent Application No. 61/528,780, filed on Aug. 30, 2011, all of which are incorporated herein by reference.

TECHNICAL FIELD

An aspect of the present disclosure relates to a plasma processing device.

BACKGROUND ART

As a plasma processing device, Patent Document 1 or Patent Document 2 discloses a parallel plate type plasma processing device. The plasma processing device disclosed in Patent Document 1 or Patent Document 2 includes a processing vessel, a gas supply unit, a lower electrode and an upper electrode. In the plasma processing device, a processing gas is supplied into a processing space by the gas supply unit to provide a high-frequency electric field between the lower electrode and the upper electrode. This generates plasma of the processing gas so that a substrate to be processed is processed by, for example, radicals of elements included in the processing gas.

PRIOR ART DOCUMENT

Patent Document

Patent Document 1: Japanese Patent Laid-open Publication No. 2008-198843
Patent Document 2: Japanese Patent Laid-open Publication No. 2008-112751

SUMMARY OF THE INVENTION

Problems to be Solved

In the above described plasma processing device, immediately after manufacturing of the device, or after replacement of a component such as an upper electrode, a seasoning process is performed. A time required for the seasoning is relatively long.

Accordingly, what is requested in the technical field is a plasma processing device capable of shortening a time for seasoning.

Means for Solving the Problems

A plasma processing device according to an aspect of the present disclosure is provided with a processing vessel, a gas supply unit, a lower electrode, and an upper electrode. The processing vessel defines a processing space. The gas supply unit is configured to supply a processing gas into the processing space. The lower electrode is provided at a lower side of the processing space. The upper electrode is provided at an upper side of the processing space, and formed with a covering layer having plasma resistance. A surface of the covering layer is polished. In an exemplary embodiment, the covering layer may be a $Y_2O_3$ layer.

When plasma etching is performed by a processing gas in the plasma processing device provided with an upper electrode having a covering layer immediately after forming, the etching speed has a tendency to be reduced as compared to the etching speed in the case where an upper electrode having a covering layer subjected to predetermined seasoning is used. It is assumed that this is due to the fact that the amount of radicals consumed to be bound to an element constituting the covering layer is increased. Also, the predetermined seasoning refers to, for example, seasoning that is performed under a condition set to stably obtain a required etching speed. It is assumed that in a case where the covering layer is formed through thermal-spraying of $Y_2O_3$, when plasma etching is performed using a gas including carbon and fluorine (CF-based gas) immediately after thermal-spraying, the amount of fluorine atom radicals consumed to be bound to Y of the $Y_2O_3$ layer is increased, thereby lowering the etching speed.

In the plasma processing device according to an aspect of the present disclosure, the surface of the covering layer of the upper electrode is polished. Accordingly, the surface area of the covering layer is smaller than the surface of the covering layer immediately after forming. That is, the surface area of the covering layer to be in contact with radicals is reduced such that the amount of radicals to be consumed to be bound to a constituent element of the covering layer is reduced. As a result, it is possible to obtain an upper electrode capable of providing an etching speed close to a required etching speed. Therefore, a time required for seasoning may be shortened.

In an aspect of the present disclosure, the surface area of the covering layer may be 30,000 $\mu m^2$ or less. Also, the surface area of the covering layer may be 20,000 $\mu m^2$ or more. By the upper electrode having a covering layer with such a surface area, it is possible to obtain an etching speed closer to a required etching speed.

Effect of the Invention

As described above, according to an aspect of the present disclosure, a plasma processing device capable of shortening a time for seasoning is provided.

DETAILED DESCRIPTION OF THE INVENTION

Figure 1:
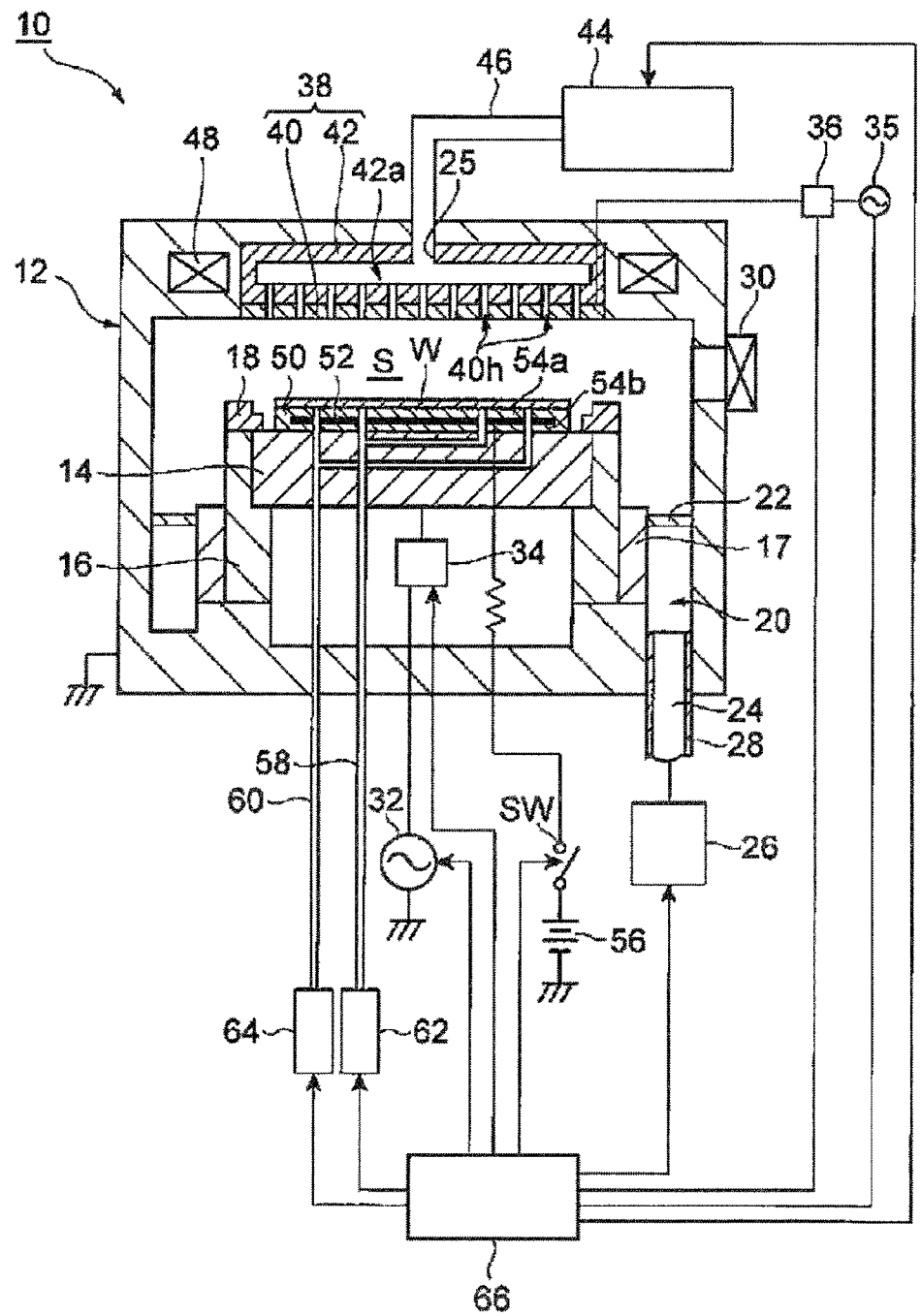
FIG. 1 is a view schematically illustrating a plasma processing device according to an exemplary embodiment.

Hereinafter, various exemplary embodiments will be described in detail with reference to drawings. In the respective drawings like parts are denoted by like reference numerals.

FIG. 1 is a view schematically illustrating a plasma processing device according to an exemplary embodiment. FIG. 1 illustrates a cross section of the plasma processing device according to an exemplary embodiment. A plasma processing device 10 illustrated in FIG. 1 is a parallel plate type plasma processing device.

The plasma processing device 10 is provided with a processing vessel 12. The processing vessel 12 has a substantially cylindrical shape, and defines a processing space S as its inner space. The plasma processing device 10 is provided with a base 14 in a substantially disk shape within the processing vessel 12. The base 14 is provided at the lower side of the processing space S. The base 14 is made of, for example, aluminum, and constitutes a lower electrode.

In an exemplary embodiment, the plasma processing device 10 is further provided with a cylindrical holding unit 16 and a cylindrical supporting unit 17. The cylindrical holding unit 16 holds the base 14 by being in contact with the lateral surface and the bottom surface periphery of the base 14. The cylindrical supporting unit 17 extends vertically from the bottom of the processing vessel 12, and supports the base 14 through the cylindrical holding unit 16. The plasma processing device 10 is further provided with a focus ring 18 placed on the top surface of the cylindrical holding unit 16. The focus ring 18 may be made of, for example, silicon or quartz.

In an exemplary embodiment, an exhaust path 20 is formed between the lateral wall of the processing vessel 12, and the cylindrical supporting unit 17. A baffle plate 22 is mounted at the inlet or in the middle of the exhaust path 20. Also, an exhaust hole 24 is provided at the bottom of the exhaust path 20. The exhaust hole 24 is defined by an exhaust tube 28 fitted to the bottom of the processing vessel 12. An exhaust device 26 is connected to the exhaust tube 28. The exhaust device 26 includes a vacuum pump, and thus may decompress the processing space S within the processing vessel 12 to a predetermined degree of vacuum. A gate valve 30 configured to open/close a carrying-in/out port of a substrate to be processed W is mounted at the lateral wall of the processing vessel 12.

A high frequency power source 32 configured to generate a high frequency power for ion attraction is electrically connected to the base 14 via a matching unit 34. The high frequency power source 32 applies a high frequency power of a predetermined high frequency (e.g., 400 KHz to 27 MHz) to the lower electrode, that is, the base 14.

The plasma processing device 10 is further provided with a shower head 38 within the processing vessel 12. The shower head 38 is provided at the upper side of the processing space S. The shower head 38 includes an electrode plate 40 and an electrode support 42.

The electrode plate 40 is a conductive plate having a substantially disk shape, and constitutes an upper electrode. A high frequency power source 35 for plasma generation is electrically connected to the electrode plate 40 via a matching unit 36. The high frequency power source 35 applies a high frequency power of a predetermined high frequency (e.g., 27 MHz or more) to the electrode plate 40. When the high frequency power is applied to the base 14 and the electrode plate 40 by the high frequency power source 32 and the high frequency power source 35, respectively, a high-frequency electric field is formed in the space between the base 14 and the electrode plate 40, that is, in the processing space S.

A plurality of gas vent holes 40h are formed in the electrode plate 40. The electrode plate 40 is detachably supported by the electrode support 42. A buffer chamber 42a is provided within the electrode support 42. The plasma processing device 10 is further provided with a gas supply unit 44, and the gas supply unit 44 is connected to a gas inlet 25 of the buffer chamber 42a through a gas supply conduit 46. The gas supply unit 44 supplies a processing gas to the processing space S. The gas supply unit 44 may supply, for example, a CF-based etching gas. The electrode support 42 is formed with a plurality of holes continued from the plurality of the gas vent holes 40h, respectively, and the plurality of holes are communicated with the buffer chamber 42a. Accordingly, the gas supplied from the gas supply unit 44 is supplied to the processing space S via the buffer chamber 42a and the gas vent holes 40h.

In an exemplary embodiment, a magnetic field forming mechanism 48 which extends annularly or concentrically is provided in the ceiling portion of the processing vessel 12. The magnetic field forming mechanism 48 serves to facilitate initiation of high frequency discharge (plasma ignition) within the processing space S so as to stably maintain the discharge.

In an exemplary embodiment, an electrostatic chuck 50 is provided on the top surface of the base 14. The electrostatic chuck 50 includes an electrode 52 and a pair of insulating films 54a and 54b. The electrode 52 is a conductive film, and is provided between the insulating film 54a and the insulating film 54b. A DC power source 56 is connected to the electrode 52 via a switch SW. When a DC voltage is applied to the electrode 52 from the DC power source 56, a Coulomb force is generated. By the Coulomb force, the substrate to be processed W is attracted and held on the electrostatic chuck 50.

In an exemplary embodiment, the plasma processing device 10 is further provided with gas supply lines 58 and 60 and heat transfer gas supply units 62 and 64. The heat transfer gas supply unit 62 is connected to the gas supply line 58. The gas supply line 58 extends to the top surface of the electrostatic chuck 50 and annularly extends at the central portion of the top surface. The heat transfer gas supply unit 62 supplies a heat transfer gas such as, for example, a He gas between the top surface of the electrostatic chuck 50 and the substrate to be processed W. Also, the heat transfer gas supply unit 64 is connected to the gas supply line 60. The gas supply line 60 extends to the top surface of the electrostatic chuck 50 and annularly extends to surround the gas supply line 58 on the top surface. The heat transfer gas supply unit 64 supplies a heat transfer gas such as, for example, a He gas between the top surface of the electrostatic chuck 50 and the substrate to be processed W.

In an exemplary embodiment, the plasma processing device 10 is further provided with a control unit 66. The control unit 66 is connected to the exhaust device 26, the switch SW, the high frequency power source 32, the matching unit 34, the high frequency power source 35, the matching unit 36, the gas supply unit 44, and the heat transfer gas supply units 62 and 64. The control unit 66 sends control signals to the exhaust device 26, the switch SW, the high frequency power source 32, the matching unit 34, the high frequency power source 35, the matching unit 36, the gas supply unit 44, and the heat transfer gas supply units 62 and 64, respectively. By the control signals from the control unit 66, exhaust by the exhaust device 26, opening/closing of the switch SW, power supply from the high frequency power source 32, impedance adjustment of the matching unit 34, power supply from the high frequency power source 35, impedance adjustment of the matching unit 36, supply of the processing gas by the gas supply unit 44, supply of the heat transfer gas by each of the heat transfer gas supply units 62 and 64 are controlled.

In the plasma processing device 10, the processing gas is supplied from the gas supply unit 44 to the processing space S. Also, the high-frequency electric field is formed between the electrode plate 40 and the base 14, that is, in the processing space S. Accordingly, plasma is generated in the processing space S, and the substrate to be processed W is etched by, for example, radicals of elements included in the processing gas.

Figure 2:
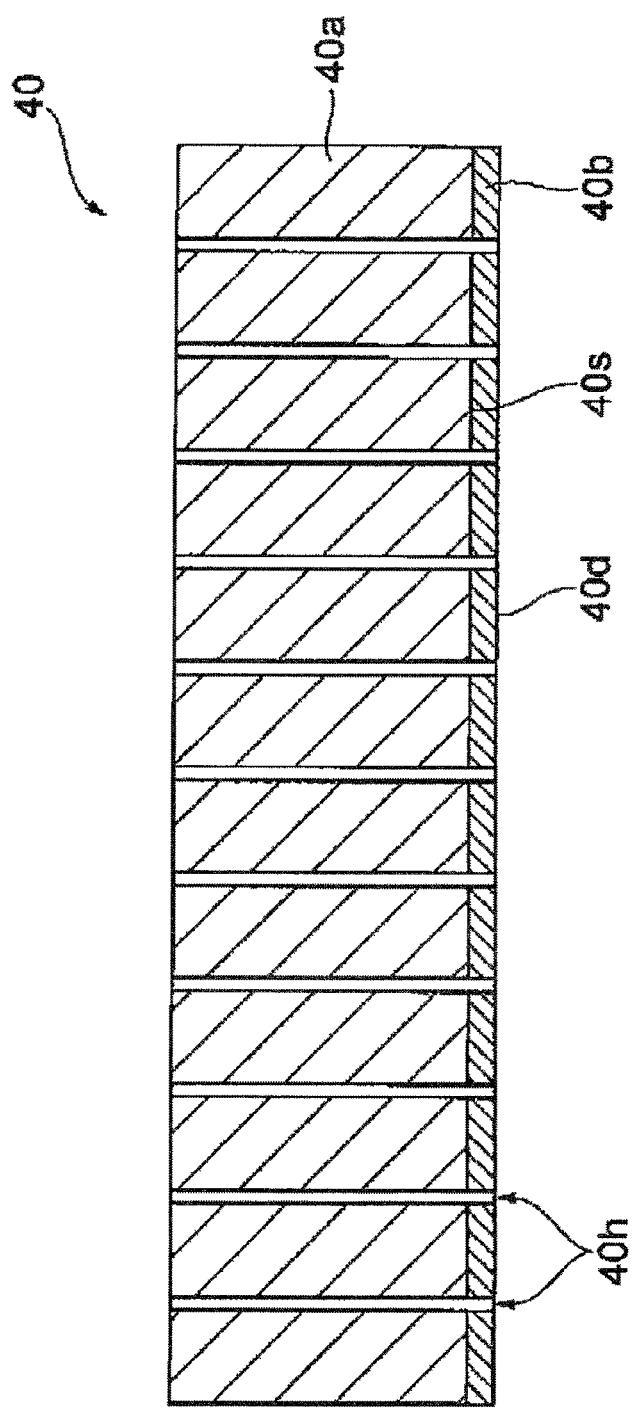
FIG. 2 is a cross-sectional view illustrating an upper electrode of the plasma processing device illustrated in FIG. 1.

Hereinafter, the configuration of the electrode plate 40 constituting the upper electrode will be described. FIG. 2 is a cross-sectional view illustrating an upper electrode of the plasma processing device illustrated in FIG. 1. As illustrated in FIG. 2, the electrode plate 40 includes a main body portion 40a and a covering layer 40b. The main body portion 40a has a substantially disk shape, and is constituted by a substrate having a surface made of, for example, aluminum. The main body portion 40a has an inner surface that defines the gas vent holes 40h. The inner surface is subjected to alumite treatment. On a surface 40s of the main body portion 40a at the processing space S side, the covering layer 40b is formed. The covering layer 40b has plasma resistance. The covering layer 40b may be formed by thermal-spraying of $Y_2O_3$. Also, the forming method and the constituent material of the covering layer 40b are not limited thereto.

The covering layer 40b is polished after formed by, for example, thermal-spraying. That is, the covering layer 40b has a polished surface 40d as a surface at the processing space S side. The surface area of the polished surface 40d as described above is smaller than the surface area of the covering layer immediately after forming. Accordingly, the amount of radicals to be bound to a constituent element of the covering layer 40b is reduced. As a result, even immediately after the electrode plate 40 is manufactured, an etching speed close to a required etching speed may be obtained. Thus, in the plasma processing device 10, a time required for seasoning may be reduced. Also, on the surface of the covering layer 40b, an additional surface treatment may be performed after the surface is polished. The surface treatment may include, for example, blasting. Ceramic particles used for the blasting may be made of $SiO_2$, $Al_2O_3$, $Y_2O_3$, or SiC.

In an exemplary embodiment, the surface area of the polished surface 40d of the covering layer 40b may be 30,000 $\mu m^2$ or less. Also, the surface area of the surface 40d may be 20,000 $\mu m^2$ or more. In the covering layer 40b having such a surface area, the etching speed immediately after the electrode plate 40 is manufactured may be closer to a required etching speed.

Figure 3:
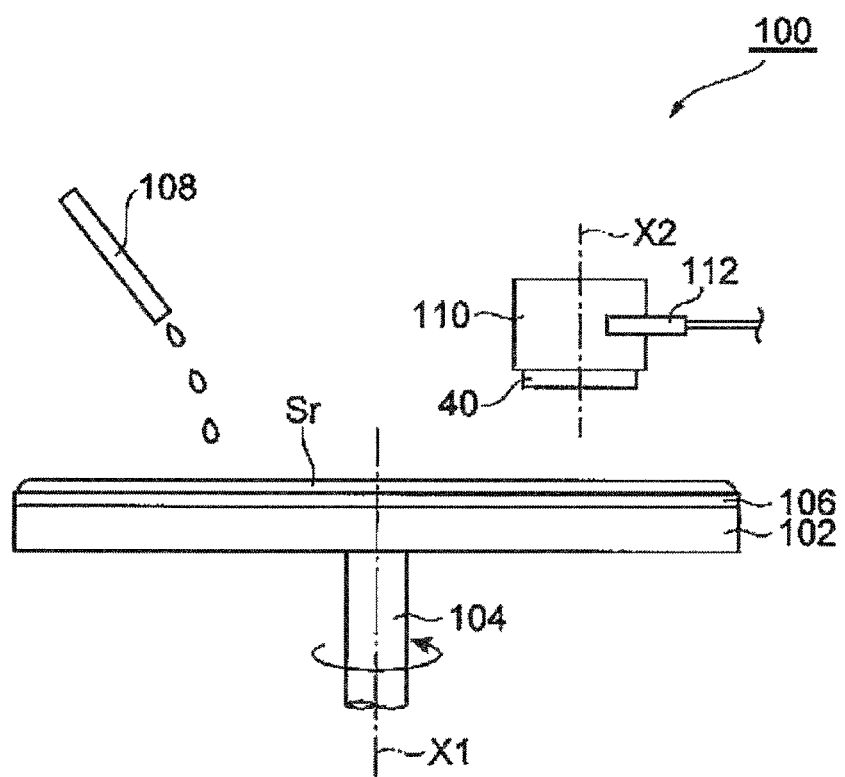
FIG. 3 is a view illustrating an example of a polishing device.

Hereinafter, reference will be made to FIG. 3. FIG. 3 illustrates an example of a polishing device used to polish the surface of the covering layer 40b. As illustrated in FIG. 3, in a polishing device 100 as an example, a polishing pad 106 is placed on the top surface of a stage 102 supported by a rotation shaft 104. A slurry (Sr) is supplied to the polishing pad 106 from a slurry supply mechanism 108. As the slurry (Sr), a slurry containing diamond abrasive grains is exemplified. Also, above the polishing pad 106, a holding unit 110 is provided. The holding unit 110 may hold the electrode plate 40 on the bottom surface thereof. The holding unit 110 is supported by a supporting unit 112. The supporting unit 112 supports the holding unit 110 in a direction perpendicular to a rotation axis X1 of the rotation shaft 104 (in the horizontal direction). Also, the supporting unit 112 supports the holding unit 110 such that the holding unit 110 may be rotated around an axis X2 parallel to the rotation axis X1. The axis X2 is located at a position shifted from the axis X1 in the horizontal direction. When the electrode plate 40 is pressed against the polishing pad 106, the electrode plate 40 and the holding unit 110 receive a force allowing themselves to rotate around the axis X2, from the polishing pad 106.

In the polishing device 100, the slurry (Sr) is supplied to the polishing pad 106 and the polishing pad 106 is rotated. Then, the electrode plate 40 [the covering layer 40b] held by the holding unit 110 is pressed against the polishing pad 106. Accordingly, the covering layer 40b of the electrode plate 40 may be polished. Also, the surface area of the covering layer 40b may be varied by adjusting the abrasive grain diameter of the slurry, the rotation speed of the rotation shaft 104, and the polished amount of the covering layer 40b (polished thickness).

EXAMPLES

Hereinafter, the present disclosure will be described in more detail with reference to examples, but the present disclosure is not limited to the examples.

In Examples 1 to 3, covering layers having different surface areas, as the covering layer 40b, were subjected to seasoning, and then an oxide film of a substrate to be processed W, that is, an $SiO_2$ film was etched to evaluate the etching speed. The surface 40d of each of Examples 1 and 2 was obtained by polishing a $Y_2O_3$ layer formed through thermal-spraying by using the polishing device illustrated in FIG. 3. The surface 40d of Example 3 was obtained by polishing an electrode plate $Y_2O_3$ layer formed through thermal-spraying by using the polishing device illustrated in FIG. 3, and performing blasting using ceramic particles ($SiO_2$). The surface areas of the surfaces 40d of Examples 1 to 3 were 22,785 $\mu m^2$, 27,325 $\mu m^2$, and 25,421 $\mu m^2$, respectively. Also, the surface areas of the surfaces 40d were measured by using a laser microscope OLS3100 manufactured Olympus Corporation and using a surface area measurement mode of the laser microscope.

Also, as a comparative example, for an electrode plate having a $Y_2O_3$ layer formed through thermal-spraying, blasting was performed on the surface of the $Y_2O_3$ layer using ceramic particles ($SiO_2$), the seasoning was performed in the same manner as that in Examples 1 to 3, and the $SiO_2$ film was etched to evaluate the etching speed. In the comparative example, the surface area of the surface of the $Y_2O_3$ layer was 39,753 $\mu m^2$. Also, in the comparative example, the surface of the $Y_2O_3$ layer was not polished.

Seasoning conditions in Examples 1 to 3 and the comparative example were as follows.
Pressure of processing space S: 20 mT
Power supplied to lower electrode: 0 W
Power supplied to upper electrode: 2000 W
Processing gas: $C_4F_6$ at flow rate of 80 sccm, mixed gas of CO at a flow rate of 500 sccm
Pressure of He gas from heat transfer gas supply unit 62: 15 T
Pressure of He gas from heat transfer gas supply unit 64: 40 T
Etching time: 120 sec
Size of substrate to be processed W: 300 mmφ
Also, etching conditions in Examples 1 to 3 and the comparative example were as follows.
Pressure of processing space S: 20 mT
Power supplied to lower electrode: 200 W
Power supplied to upper electrode: 1,800 W
Processing gas: $CHF_3$ at flow rate of 135 sccm, CO at flow rate of 465 sccm, mixed gas of $O_2$ at flow rate of 18 sccm
Pressure of He gas from heat transfer gas supply unit 62: 15 T Pressure of He gas from heat transfer gas supply unit 64: 40 T Etching time: 30 sec Size of substrate to be processed W: 300 mmφ

The etching speed was obtained by measuring the thickness of a substrate to be processed W before and after etching at the center of the substrate to be processed W, and at respective points ±30 mm, ±60 mm, ±90 mm, ±120 mm, ±130 mm, ±145 mm in the radial direction from the center, obtaining an average value of the obtained measurement values, converting the average value in terms of the etching speed per minute, and determining the conversion value as the etching speed.

The etching speeds of Examples 1 to 3 were 129.6 nm/min, 131.2 nm/min, and 133.2 nm/min, respectively. Meanwhile, the etching speed of the comparative example was 127.4 nm/min. It was found that in Examples 1 to 3, an etching speed closer to a required etching speed (132 nm/min) was obtained as compared to an etching speed in the comparative example.

DESCRIPTION OF REFERENCE NUMERALS

| | |
|---|---|
| 10: plasma processing device | 12: processing vessel |
| 14: base | 18: focus ring |
| 26: exhaust device | 28: exhaust tube |
| 30: gate valve | 32: high frequency power source |
| 34: matching unit | 35: high frequency power source |
| 36: matching unit | 38: shower head |
| 40: electrode plate | 40h: gas vent holes |
| 40a: main body portion | 40b: covering layer |
| 40d: surface (covering layer) | 42: electrode support |
| 44: gas supply unit | 50: electrostatic chuck |
| 58: gas supply line | 60: gas supply line |
| 62: heat transfer gas supply unit | 64: heat transfer gas supply unit |
| 66: control unit | S: processing space |
| W: substrate to be processed | |

What is claimed is:

1. A method of manufacturing an upper electrode of a plasma processing device including a processing vessel configured to define a processing space where plasma is generated, a gas supply unit configured to supply a processing gas into the processing space, a lower electrode provided at a lower side of the processing space, and the upper electrode provided at an upper side of the processing space, the method comprising:

forming a covering layer on a lower surface of a main body portion of the upper electrode facing a side of the processing space where an etching process is performed, the covering layer being formed with a material having plasma resistance:

after forming the covering layer, polishing a surface of the covering layer exposed to the processing space; and after polishing the covering layer, blasting the surface of the covering layer that has been polished.

2. The method of claim 1, wherein the covering layer is a $Y_2O_3$ layer.

3. The method of claim 1, wherein the surface of the covering layer that has been polished has a surface area ranging from 20,000 pm$^2$ to 30,000 pm$^2$.

4. The method of claim 1, wherein ceramic particles are used for blasting the surface of the covering layer and the ceramic particles include at least one of $SiO_2$, $Al_2O_3$, $Y_2O_3$, and SiC.

5. The method of claim 1, wherein, in the polishing the surface of the covering layer, the surface of the covering layer is polished using a polishing pad and a slurry thereby reducing a surface area of the covering layer.

6. The method of claim 5, wherein the slurry includes diamond abrasive grains.

* * * * *